(12) United States Patent
Trump et al.

(10) Patent No.: US 7,092,514 B2
(45) Date of Patent: Aug. 15, 2006

(54) AUDIBILITY ENHANCEMENT

(75) Inventors: Tõnu Trump, Bandhagen (SE); Anders Eriksson, Uppsala (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 177 days.

(21) Appl. No.: 10/785,399

(22) Filed: Feb. 25, 2004

(65) Prior Publication Data
US 2005/0004796 A1 Jan. 6, 2005

Related U.S. Application Data

(60) Provisional application No. 60/449,879, filed on Feb. 27, 2003.

(51) Int. Cl.
*H04M 1/00* (2006.01)
(52) U.S. Cl. ................................. 379/390.03; 379/395
(58) Field of Classification Search ................ 379/390, 379/395, 388, 392; 455/570; 381/104, 108, 381/109, 57, 94.1, 94.7
See application file for complete search history.

(56) References Cited

U.S. PATENT DOCUMENTS 5,357,567 A * 10/1994 Barron et al. .......... 379/406.06
5,524,148 A    6/1996 Allen et al.
5,612,996 A * 3/1997 Li ........................ 379/406.06
5,615,256 A * 3/1997 Yamashita ............ 379/390.01
6,205,217 B1   3/2001 Nobusawa

FOREIGN PATENT DOCUMENTS

WO          00/39991 A1    7/2000

OTHER PUBLICATIONS

ITU-T Recommendation P.56, "Telephone Transmission Quality Objective Measuring Apparatus", "Objective Measurement of Active Speech Level", International Telecommunication Union, Mar. 1993.
ITU-T Recommendation G.121, "Transmission Systems and Media; General Characteristics of National Systems Forming Part of International Connections", Loudness Ratings (LRs) of Naitonal Systems, Mar. 1993.

* cited by examiner

*Primary Examiner*—Sinh Tran
*Assistant Examiner*—Walter F Briney, III
(74) *Attorney, Agent, or Firm*—Nixon & Vanderhye, P.C.

(57) ABSTRACT

An apparatus for enhancing audibility of a far-end speech signal from a far-end user to a near-end user in a telephony system includes a near-end background noise signal level estimator (26) at the near-end user. A near-end speech signal level estimator (24) is also provided at the near-end user. A gain control logic (22) determines a gain (G) for amplification of the far-end speech signal based on both estimated speech and background noise signal levels.

10 Claims, 5 Drawing Sheets

AUDIBILITY ENHANCEMENT

This application claims priority to U.S. Provisional Application No. 60/449,879, filed 27 Feb. 2003. The entire contents of this application are incorporated herein by reference.

TECHNICAL FIELD

This invention relates to audibility enhancement by controlling the level of the loudspeaker signal in a terminal, for example a mobile handset, in a telephone system when used in a noisy environment.

BACKGROUND

When making a telephone call in a noisy environment the audibility of the far-end speech may at times be low, since the loudspeaker signal may be drowned by the background noise at the near-end. At such occasions, it would be beneficial to increase the loudness of the far-end speech signal in order to improve the audibility.

Most mobile terminals used today include a manual volume control that can be used for increasing the loudspeaker volume. However, this may not always solve the problem of enhancing the audibility, and that mainly depends on the so-called side-tone that most often is included in a mobile terminal. The side-tone adds a portion of the talkers voice to the loudspeaker in order to make the terminal sound "more alive". Typically, the side-tone is at a level of approximately 10–20 dB below the microphone level, see ITU-T Recommendation G.12I. The perception of the side-tone is very sensitive to the time-delay between the side-tone and the talkers voice. This time-delay should preferably be short, hence the side-tone has traditionally been implemented as an attenuated (by 10–20 dB) version of the microphone signal.

Although the side-tone is intended to add the talkers voice to the loudspeaker, any background environmental noise may also be added to the loudspeaker via the side-tone, thus causing the far-end voice to be contaminated by near-end noise. If the near-end background environmental noise is very high, this may cause the audibility of the far-end speech to be reduced due to a low signal-to-noise ratio. In this situation it is desirable for the user to increase the level of the far-end speech. Depending on the implementation of the volume control in the terminal, this may or may not increase the audibility. If the volume control is implemented (digitally) on the down-link signal and the side-tone level is not connected to the volume level, then the signal-to-noise ratio of the far-end speaker will be increased by this action. Should, however, the volume control be implemented as an analogue amplification of the loudspeaker signal, or the side-tone level is dependent on the volume setting of the phone, then the mobile terminal user is not helped by any manual volume control in the handset, since this will amplify both the far-end speech and the near-end noise stemming from the side-tone, and the signal-to-noise ratio will remain at a constant value regardless of the loudspeaker volume level.

The problem of increasing the audibility has been addressed in U.S. Pat. No. 5,5524,148, Allen et al. by including a processing function in the network that amplifies the far-end signal based on the noise level present at the mobile user side. Since this amplification only affects the far-end signal and not the noise signal added locally in the terminal via the side-tone, this approach will increase the signal to noise ratio.

The solution described in U.S. Pat. No. 5,5524,148, Allen et al. amplifies the far-end signal based on the noise level from the near-end. This solution is based on the assumption that whenever a user is present in an environment with a high background noise level, the user will benefit from an increased level of the far-end signal.

This assumption may be valid if the user is using a mobile terminal with a traditional design, i.e. a mobile handset where the side-tone is implemented as an attenuated replica of the microphone signal. However, with the increased diversity in the design of mobile terminals, there may be several situations when the user does not have any problem with the audibility of the far-end speaker, although the user is positioned in an environment with a high background noise. Examples of terminal equipment where there possibly are no problems with the audibility although used in a noise environment are:

1. Handsets with volume control that does not affect the side-tone level or with more advanced side-tone implementations (including noise suppressing techniques in the side-tone).
2. Hands-free accessories designed for noisy conditions (such as car hands-free kits with loudspeaker volume and frequency characteristics dependent on the environmental noise) and for which there are no side-tones added to the loudspeaker.
3. Headsets or ear-plugs which reduce the perceived environmental noise level.
4. Handsets with active noise control.

This should not be seen as an exclusive list, but serve as examples of terminal equipment that are designed to operate properly in environments with a high acoustical background noise.

In situations where the terminal equipment has been designed to operate in noisy conditions, any level adjustment made in the network may degrade the overall perceived quality of the conversation. Firstly, raising the level of the far-end speech may cause the terminal equipment at the near-end to not function as designed. Secondly, and perhaps most important, the speech and talker levels in a conversation is coupled via the human perception of speech levels. As outlined in the following, any amplification of the signal in the network may influence the speech levels in a non-desired way if implemented without specific knowledge of the situation.

In a conversation, a talker tends to adjust the level of the voice to the level of the other party and also to the background noise. Similarly, when exposed to speech in a telephone conversation via a loudspeaker (either in a handset, hands-free or headset), a talker tends to adjust the voice level to a similar level as perceived from the loudspeaker. Thus, if the level of the far-end speech is raised the near-end user is also likely to unconsciously increase the voice level. If the terminal equipment at the near-end has been designed to work properly even in an environment with a high background noise, this increase of the voice level is affecting the user in a negative way (e.g. more strain to the voice) without adding any benefit of increased audibility.

An example of the problem described in the previous section is when using a headset in a noisy environment. With a proper design of the headset, the user is likely to have no problems hearing the far-end talker at nominal signal levels and is likely to talk at a comfortable and natural speech level. Should, however, the level of the far-end talker be increased by any network equipment (due to the measurement of a high background noise level from the near-end), the near-end talker may unconsciously also increase the voice level with more strain to the voice and less privacy as an effect.

In the example above it should be noted that with a headset the user is less exposed to the background noise and the voice is not raised due to the high level of the background noise, as would be the case if using an ordinary handset. When using an ordinary handset in a noisy environment and being fully exposed to the background noise and having a side-tone in the handset with a high noise level, the near-end user would benefit from having an increased far-end speech level, as outlined in the previous section.

Thus, there is a need for an improved method for enhancing the audibility for users of ordinary mobile handset without degrading the overall performance in situations with terminal equipment designed for environments with high near-end background noise.

SUMMARY

The far-end signal level is selectively adjusted in situations when this increases audibility and to leave the far-end signal essentially unaltered when it does not.

Briefly, the solution to the described problem is based on adjusting the signal level of the far-end speaker as a function varying in both the near-end background noise level and the near-end speech level.

This solution is based on the assumptions that if the terminal equipment at the near-end side is designed to operate in a noisy environment, it is likely that the near-end user will have a speech level close to the nominal level Similarly, if the near-end user is in a situation where there is a high likelihood of experiencing problems with the audibility of the far-end, the near-end speech level is likely to be high due to a raised voice level as an effect of the high background noise. The invention provides the advantage of increasing the audibility of the far-end speech for terminal users in noisy environments without degrading the performance for users with terminals designed for noisy conditions.

BRIEF DESCRIPTION OF THE DRAWINGS

The invention, together with further objects and advantages thereof, may best be understood by making reference to the following description taken together with the accompanying drawings, in which.

DETAILED DESCRIPTION

In the following description the same reference designations will be used for the same or similar elements throughout the figures of the drawings. Furthermore, in order to avoid cluttering of the figures, only elements necessary to explain the invention are shown in the drawings. Thus, elements such as radio equipment, speech coders/decoders, etc. have been omitted.

Figure 1:
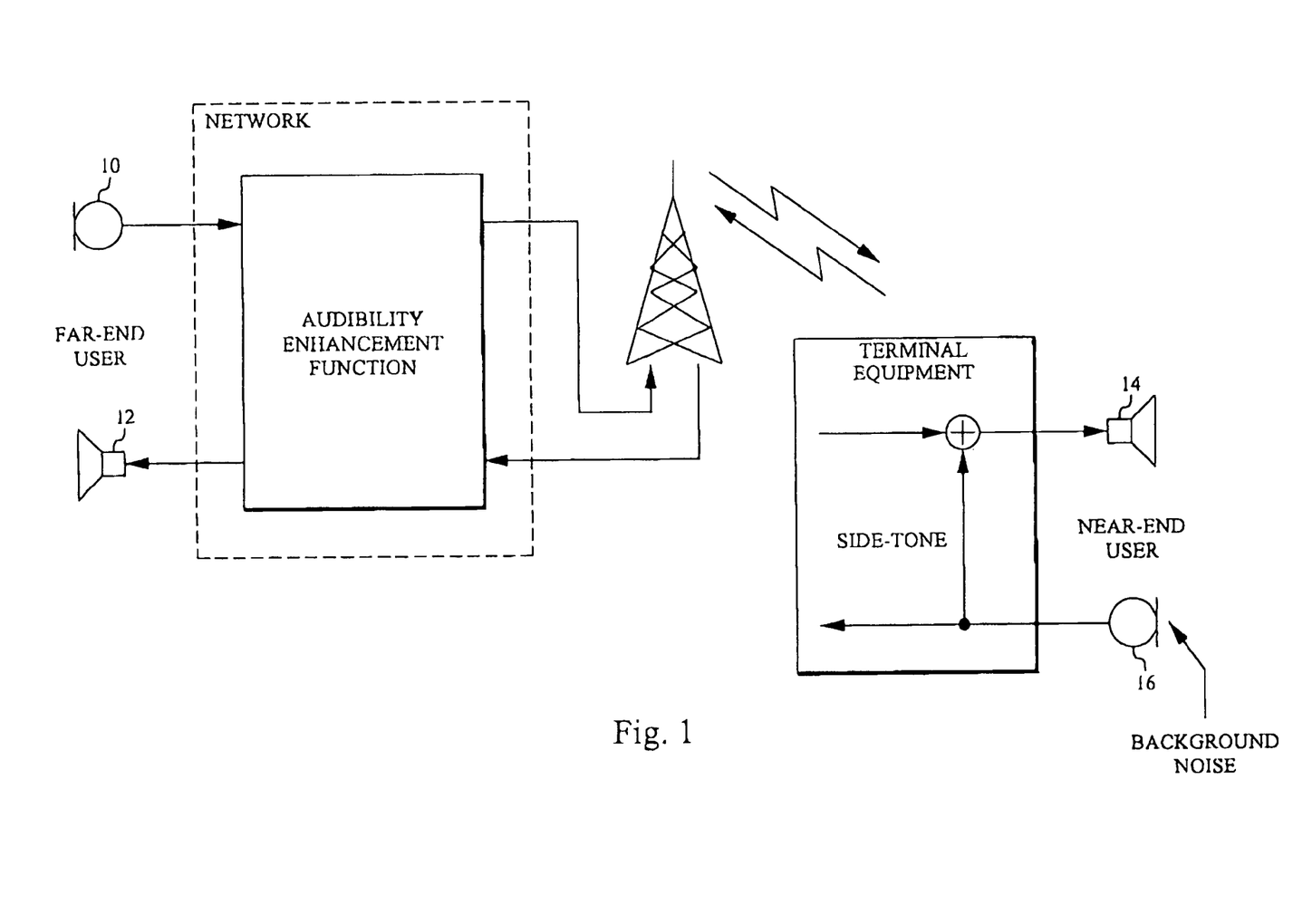
FIG. 1 is a diagram illustrating the background of the present invention.

The problem at hand and the terminology used in this document is described in FIG. 1. A far-end or sending user provided with a telephone set having a microphone 10 and a loudspeaker 12 sends speech signals over a telephone network to a near-end or receiving user provided with a terminal having a loudspeaker 14 and a microphone 16. The terminal equipment at the near-end picks up near-end speech and near-end background noise in microphone 16. In some embodiments of the terminal equipment a portion of this noise is added to the received far-end signal as a side-tone before the combined signal reaches near-end loudspeaker 14. As noted above, this side tone may or may not influence the audibility of the received far-end speech signal. In a noisy near-end environment audibility may be enhanced by the network, for example by amplifying the far-end signal as described in U.S. Pat. No. 5,524,148, Allen et al. However, as was also described above, this may not always be desirable. Thus, a more flexible method that can cope with different needs would be desirable.

Figure 2:
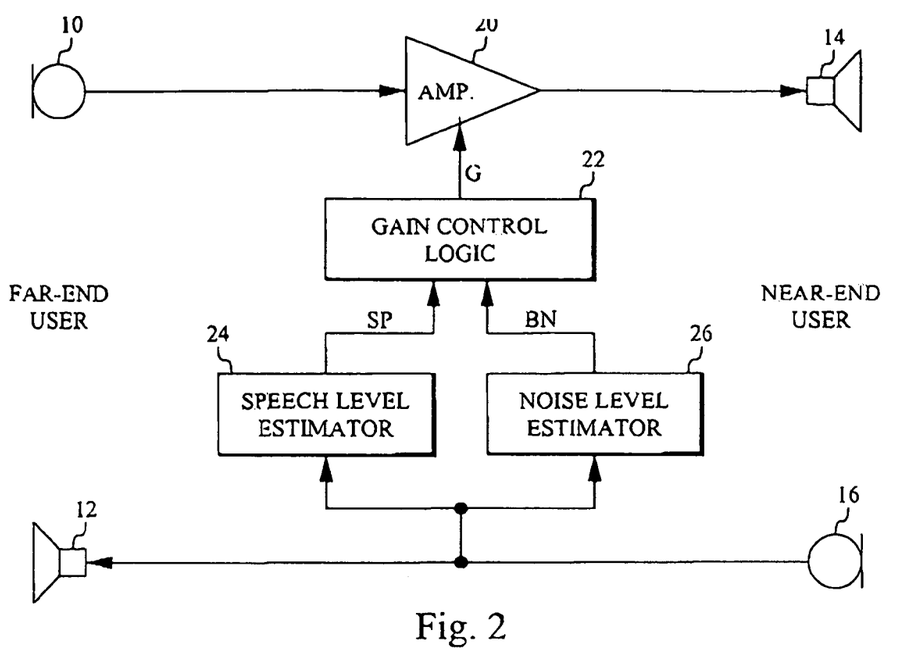
FIG. 2 is a block diagram of a first exemplary embodiment of audibility enhancement apparatus.
Figure 3:
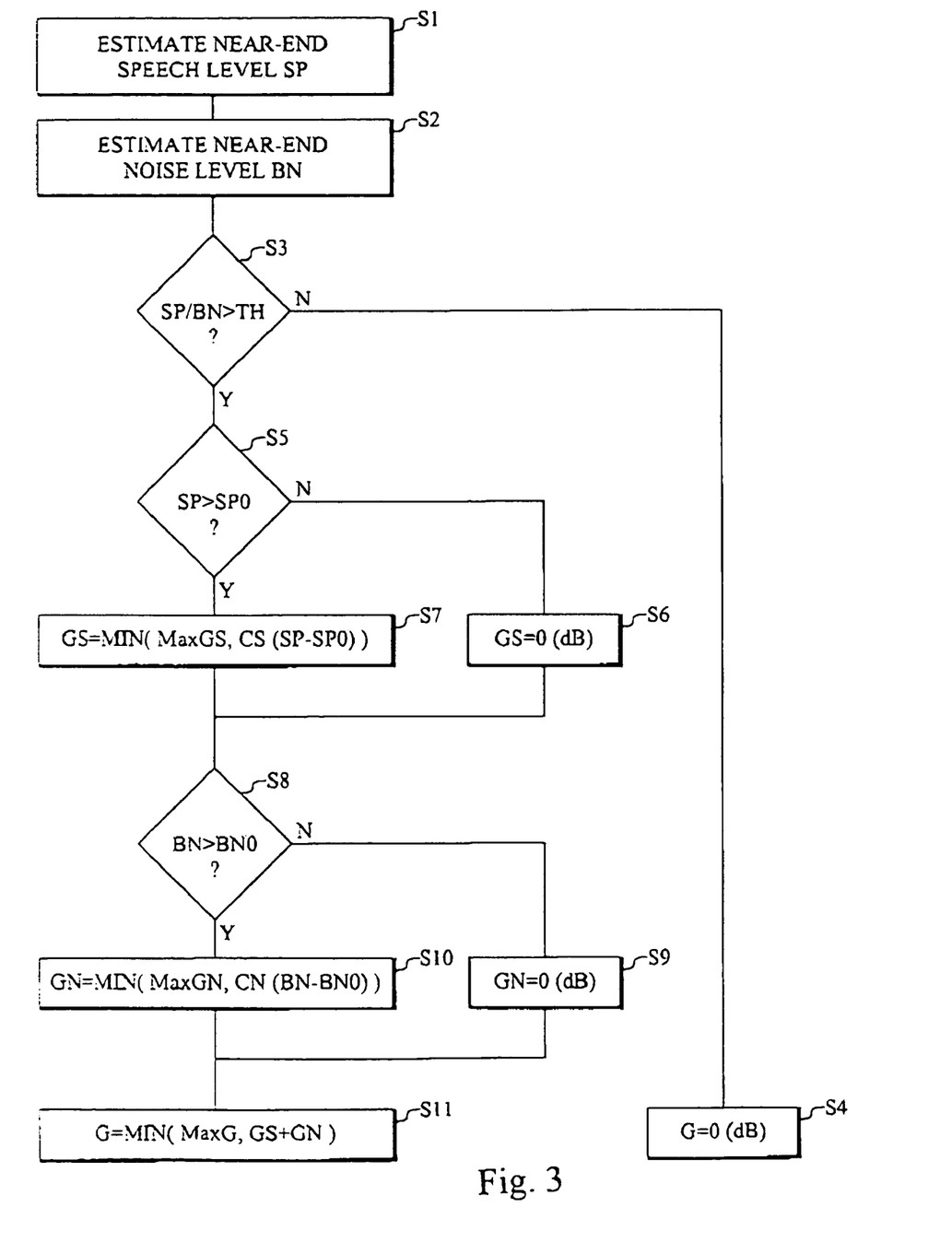
FIG. 3 is a flow chart of an exemplary embodiment of an audibility enhancement method.

FIG. 2 is a block diagram of a first exemplary embodiment of an apparatus in accordance with the present invention. The far-end signal is amplified by an amplifier 10 having a gain G controlled by a gain control logic 22. Gain control logic 22 controls the gain by using level estimates SP and BN of both the near-end speech signal and the near-end background noise. These are derived from the near-end signal in accordance with, for example, the methods described in APPENDIX 1 and APPENDIX 2, respectively. These estimations are performed by estimators 24 and 28, respectively FIG. 3 is a flow chart of an exemplary embodiment of the gain control method in accordance with the present invention. Step S1 estimates the current near-end speech level SP, for example in accordance with the method described in APPENDIX 1. Step S2 estimates the current near-end background noise level BN, for example in accordance with the method described in APPENDIX 2. Step S3 tests whether the signal-to-noise ratio SP/BN exceeds a threshold TH, which typically lies in the interval 5–15 dB, for example it may be equal to 9 dB. If SP/BN does not exceed threshold TH, the gain G is set to 0 dB (gain=1) in step S4.

If SP/BN does exceed threshold TH, the procedure performs step S5, which tests whether the determined speech level SP exceeds a predetermined minimum speech level SP0, which typically lies in the interval −35–−15 dBm0, for example it may be equal to −25 dBm0. If SP does not exceed this minimum level, step S6 sets the speech contribution GS of the total gain G to 0 (dB). Otherwise step S7 sets the speech contribution GS of the total gain G to $$GS = \min(\text{Max}GS, CS(SP-SP0))$$

where MaxGS is the largest allowed value of GS and CS is a speech gain scaling factor. MaxGS typically lies in the interval 2–8 dB, for example it may be equal to 5 dB. Scaling factor CS typically lies in the interval 0.1–1, for example it may be equal to 0.5.

Next, step S8 tests whether the determined background noise level BN exceeds a predetermined minimum background noise level BN0, which typically lies in the interval −50–−30 dBm0, for example it may be equal to −40 dBm0. If BN does not exceed this minimum level, step S9 sets the background noise contribution GN of the total gain G to 0

(dB). Otherwise step S10 sets the background noise contribution GN of the total gain G to GN=min (MaxGN, CN(BN−BN0))

where MaxGN is the largest allowed value of GN and CN is a background noise scaling factor. MaxGN typically lies in the interval 2–8 dB, for example it may be equal to 5 dB. Scaling factor CN typically lies in the interval 0.1–1, for example it may be equal to 0.5.

Finally, step S11 determines the total gain G in accordance with

G=min (MaxG, GS+GN)

where MaxG is the largest allowable total gain, which typically lies in the interval 5–15 dB, for example it may be equal to 10 dB.

Figure 4:
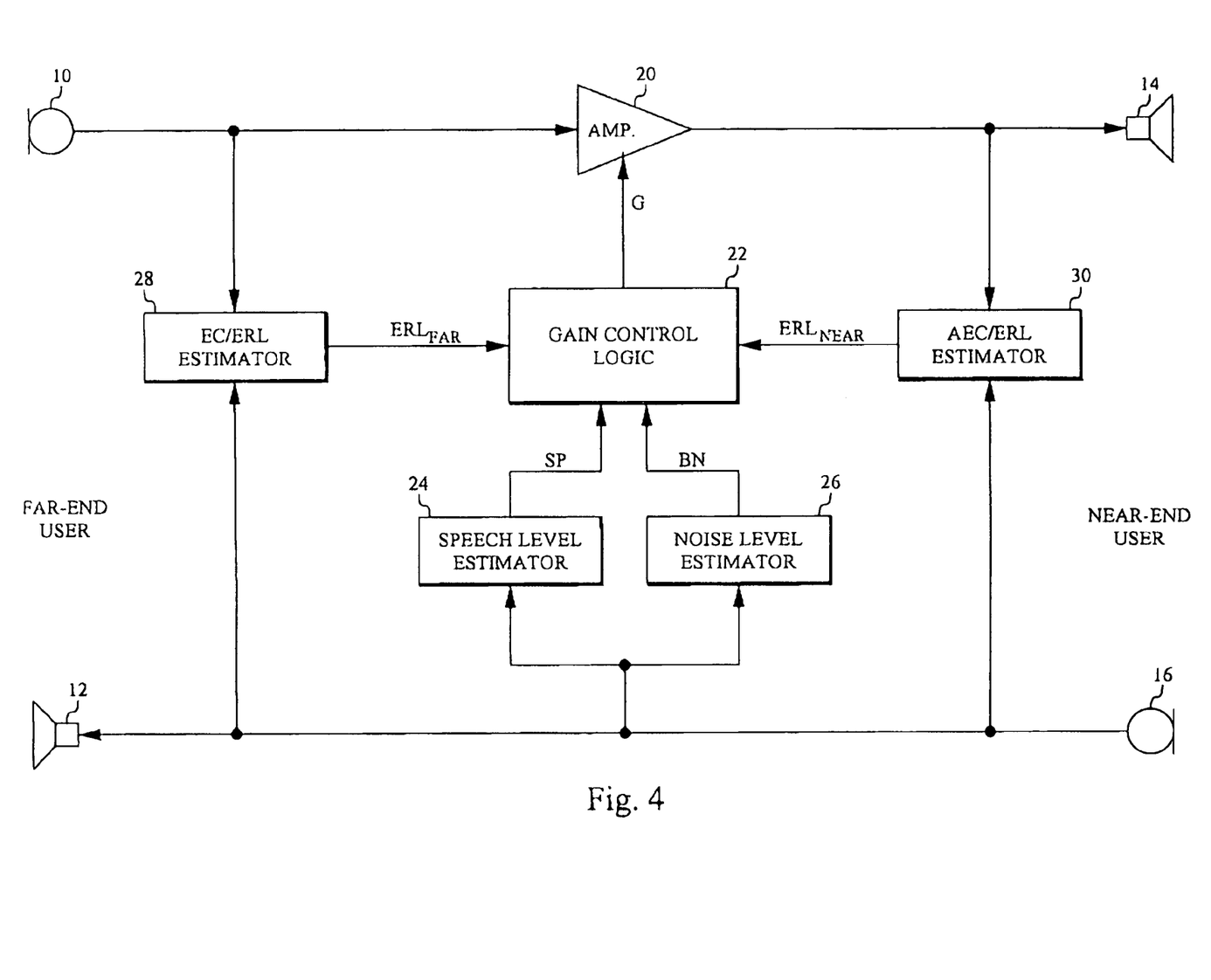
FIG. 4 is a block diagram of a second exemplary embodiment of audibility enhancement apparatus.

In order to guarantee stability of the communication loop, the total loop gain must be less than unity. As the audibility enhancement function can increase the gain in one direction of transmission and thereby the total loop gain, there is a risk that loop stability may be lost. To avoid this from happening, the echo return losses (ERL) at one or both sides of the function may be estimated and the results may be accounted for when determining the gain G. The ERL values characterize attenuation at the corresponding ends of the loop. If the audibility enhancement function is integrated with other speech enhancement functions, the echo return loss estimates at the far and near ends can be obtained from a network echo canceller (EC) 28 and an acoustic echo canceller (AEC) 30, respectively, as illustrated in the second exemplary embodiment in FIG. 4. With these MaxG may be made dependent on the echo return losses $ERL_{NEAR}$ and $ERL_{FAR}$ in accordance with MaxG=min (MaxGL, $ERL_{NEAR}$+$ERL_{FAR}$−$M_S$)

where MaxGL is a constant largest gain limit, which typically lies in the interval 5–15 dB, for example it may be equal to 10 dB, and Ms is stability margin, which in a preferred embodiment lies in the interval 3–6 dB.

Figure 5:
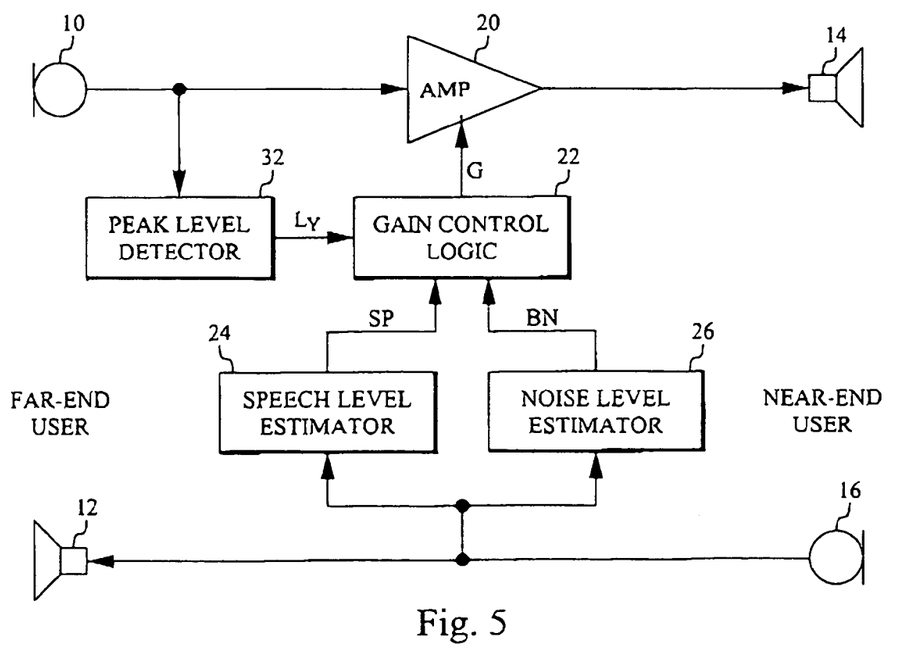
FIG. 5 is a block diagram of a third exemplary embodiment of audibility enhancement apparatus.

The audibility enhancement function may also include a peak level detector of the far-end signal. The information from this detector is used to guarantee that the amplified signal remains inside the dynamic range of the PCM codec i.e. to avoid peak saturation of the output signal. An embodiment having such a peak level detector 32 for determining a far-end peak level estimate $L_y$ is illustrated in FIG. 5. The estimate $L_y$ may, for example, be determined in accordance with the method described in APPENDIX 3. In this embodiment the largest allowable total gain MaxG may be determined as MaxG=min (MaxGL, $L_{SAT}$−$M_{SAT}$−$L_y$)

where $L_{SAT}$ is the saturation level of PCM code and $M_{SAT}$ is a saturation margin in the interval 3–10 dB, for example it may be equal to 6 dB.

Figure 6:
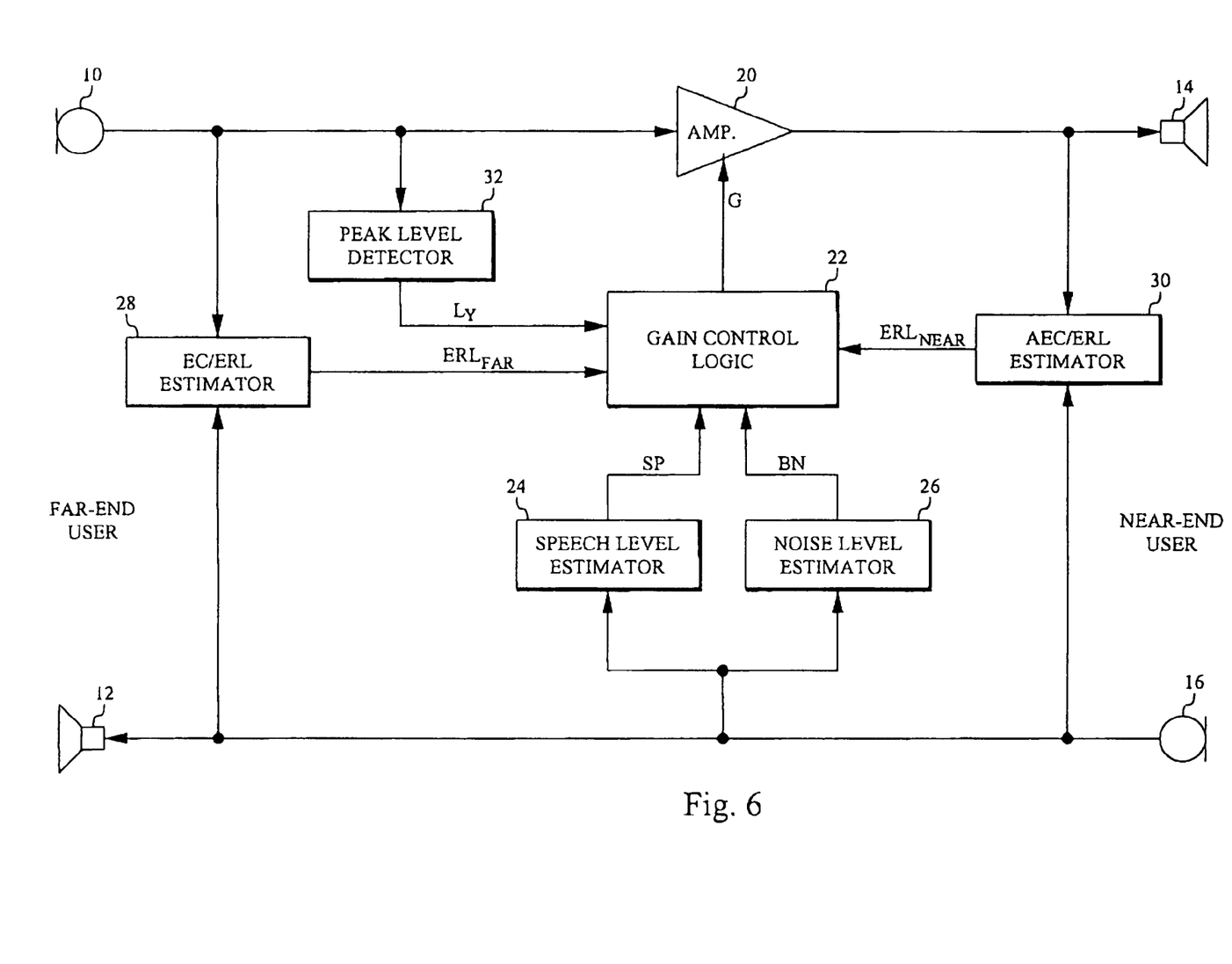
FIG. 6 is a block diagram of a fourth exemplary embodiment of audibility enhancement apparatus.

FIG. 6 is a block diagram of a fourth exemplary embodiment of an apparatus in accordance with the present invention. This embodiment combines the features of the embodiments of FIGS. 2, 4 and 5. In this embodiment the largest allowable total gain MaxG may be determined as MaxG=min(MaxGL, $ERL_{NEAR}$+$ERL_{FAR}$−$M_S$, $L_{SAT}$−$M_{SAT}$−$L_y$)

The actual gain applied to the far-end signal is preferably a low-pass filtered version of the determined gain G. The low-pass filter is preferably selected such that the rate-of-change of the applied signal gain is limited to the interval 5–15 dB/s, for example it may be equal to 10 dB/s.

The various blocks in the described embodiments of the present invention are typically implemented by a microprocessor, a digital signal processor or a micro/signal processor combination and corresponding software, However an ASIC (Application Specific Integrated Circuit) is also feasible.

Furthermore, the described audibility enhancement principles are applicable to both mobile and stationary terminals.

It will be understood by those skilled in the art that various modifications and changes may be made to the present invention without departure from the scope thereof, which is defined by the appended claims.

Appendix 1—Speech Level Estimation

There are several known ways to estimate speech level SP, see e.g. ITU-T Recommendation P.56. The preferred embodiment uses a modified version of method B of recommendation P.56 (called "P.56" below) described in ITU-T Recommendation P.56 that measures the so called active speech level.

For the purposes of this application it is desirable that the method is able to follow changes in speech level. One possibility to accomplish this is to divide the far-end signal into blocks of certain duration e.g. 10 seconds (possibly with some overlap) and compute the active speech level each time a new block is filled with signal samples. The drawback of this straightforward approach is that for blocks with no or little speech activity the method will output noise level. To avoid this from happening, an external voice activity detector may be used.

Instead of including an external voice activity detector, the decision whether the signal comprises speech and noise or noise only can be made by using internal variables used in the P.56 level measurement device. In the following, the P.56 level measurement method is described and then it is shown how its internal variables can be used to select relevant measurement intervals for which the output of the P.56 method is the active speech level and not the background noise level.

The P.56 level measurement device computes the envelope q(t) of the signal by two-stage exponential averaging of the rectified signal values in accordance with:

$p(t)=g \cdot p(t-1)+(1-g) \cdot |x(t)|$, $q(t)=g \cdot q(t-1)+(1-g) \cdot p(t)$, where x(t) is the down-sampled (by 10) input signal and g is a predetermined constant g=0.9592, p(0)=0, q(0)=0. Then a series of threshold values $c_j$ are applied to the envelope. The threshold values are spaced in geometric progression, at intervals of not more than 2:1(6.02 dB) covering the dynamic range of the signal. Let the threshold values be numbered in the order of increasing levels i.e. $c_0$ corresponds to the lowest threshold level. The series of activity counts, $a_j$, and corresponding hangover counts, $h_j$, are then found by comparing the envelope to the thresholds as follows:

For each value of j:
If $q(t) \geq c_j$, then $a_j=a_j+1$ and $h_j=0$;
If $q(t)<c_j$ and $h_j<I$, then $a_j=a_j+1$ and $h_j=h_j+1$
If $q(t)<c_j$ and $h_j=I$, then do nothing.

In the first case, the envelope is at or above the jth threshold, so that the speech is considered active as judged by that threshold level. In the second case, the envelope is below the threshold, but the speech is still considered active because the corresponding hangover has not yet expired. In the third case, the speech is inactive as judged by the threshold level in question. I=160 is a constant.

Additionally the P.56 level measurement device computes the sum of squares of the down-sampled input signal over the measurement interval of length n in accordance with:

$$sq = \sum_{t=0}^{n-1} x^2(t)$$

The active speech level estimate is computed for each j as:

$$A_j = \frac{sq}{a_j}$$

Finally, the level $A_j$ which is closest to its corresponding threshold $c_j$ times a margin m (15.9 dB) is selected as the active speech level SP. For the result to be valid the measurement interval should be selected such that it mostly contains active speech.

Since the value of the lowest threshold $c_0$ is lower than most background noise levels, it follows that the activity count for lowest the threshold $a_0$ is increased by one with (almost) every incoming sample. Similarly, if the input signal comprises speech and background noise, all the activity counts below the noise level are increased by one with every incoming sample. It also follows, that:

$a_i \leq a_j$ if i>j.

These observations lead to a simple way to decide whether the current block of data mostly consists of speech or noise samples. The procedure is as follows:

With each incoming sample and after updating the activity counts, find the first activity count $a_m$ having a value that is less than 75% of the activity count corresponding to the lowest threshold $a_0$. The search should start from $a_0$ and proceed towards higher threshold values.

The above is equivalent to finding:

$$m = \min_i (a_i < 0.75 a_0).$$

Then check if $a_m$ has reached a predetermined value $d_1$(preferred $d_1$=2000, which corresponds to approximately 2.5 seconds of active speech). If yes, then use the current block for computation of the active speech level and start a new measurement interval. Otherwise, check if the block length, n, is larger than a second predetermined value $d_2$(preferred $d_2$=4d1). If this is the case, drop the current block as it consists mostly of noise only samples and start a new measurement interval. If none of the above is the case, then continue collecting data into the current measurement interval.

To obtain more reliable results it is preferred to add the activity counts and the sums of squared input samples from several most recent valid measurement intervals (preferred 3) before computing the active speech level.

Appendix 2—Noise Level Estimation

The near-end background noise level BN can be estimated using well-known techniques. For example, an estimate of the noise level can be obtained by first low pass filtering squared samples of the signal in accordance with:

$$P_x(t) = \rho_x \cdot P_x(t-1) + (1-\rho_x) \cdot x^2(t)$$

and then selecting the minimum value of the result over a proper observation interval. In the above equation $P_x(t)$ is the short-term power estimate of signal x at time t and $0 \leq \rho_x \leq 1$ is a constant, for example equal to 0.01. The observation interval should be selected long enough to guarantee that some part of the signal in the observation interval comprises noise only. On the other hand the interval should be short enough to allow the estimate to follow changes in background noise. The interval is typically selected in the range 5–15 seconds, for example 10 seconds.

Alternatively, if the audibility enhancement function is integrated with other voice enhancement functions, the acoustic echo control function may provide the background noise level estimate.

Appendix 3—Peak Level Detector

The peak level detector can be implemented by first computing a short-term power estimate of the far-end signal in accordance with:

$$P_y(t) = \rho_y \cdot P_y(t-1) + (1-\rho_y) \cdot y^2(t).$$

where $0 \leq \rho_y \leq 1$ is a constant, for example equal to 0.01. The far-end peak level estimate $L_y$ can then be obtained by following calculations:

If $L_y(t) \leq P_y(t)$, then $L_y(t) = P_y(t)$, else $L_y(t) = \beta L_y(t-1)$, where $\beta$ is a predetermined constant, selected to be close to but less than unity. For example, $\beta = 0.998$ may be selected. Preferably downscaling of the peak level estimate by $\beta$ is done only when near-end speech is present i.e. the estimate is not modified during the speech pauses.

The invention claimed is:

1. A method of enhancing audibility of a far-end signal received at a near-end user in a telephone system by applying a gain to said far-end speech signal, the method comprising:
   determining whether a ratio between an estimated near-end speech signal level and an estimated near-end background noise level exceeds a first threshold; and
   increasing said gain if said ratio exceeds said first threshold and at least one of said estimated near-end speech signal level and said estimated near-end background noise level exceeds a second and third threshold, respectively.

2. The method of claim 1, further comprising:
   determining a fourth threshold from an estimated maximum far-end speech signal level;
   limiting said gain to values below said fourth threshold.

3. The method of claim 1, further comprising:
   determining a fifth threshold from at least one estimated echo return loss;
   limiting said gain to values below said fifth threshold.

4. The method of claim 1, further comprising:
   determining a fourth threshold from an estimated maximum far-end speech signal level;
   determining a fifth threshold from at least one estimated echo return loss;
   limiting said gain to values below a smallest of said fourth and fifth thresholds.

5. The method of claim 1, further comprising low pass filtering said gain before application to said far-end speech signal.

6. An apparatus for enhancing audibility of a far-end speech signal received at a near-end user in a telephone system by applying a gain to said far-end speech signal, including
- means for determining whether a ratio between an estimated near-end speech signal level and an estimated near-end background noise level exceeds a first threshold; and
- means for increasing said gain if said ratio exceeds said first threshold and at least one of said estimated near-end speech signal level and said estimated near-end background noise level exceeds a second and third threshold, respectively.

7. The apparatus of claim 6, further comprising:
- means for determining a fourth threshold from an estimated maximum far-end speech signal level,
- means for limiting said gain to values below said fourth threshold.

8. The apparatus of claim 6, further comprising:
- means for determining a fifth threshold from at least one estimated echo return loss;
- means for limiting said gain to values below said fifth threshold.

9. The apparatus of claim 6, further comprising:
- means for determining a fourth threshold from an estimated maximum far-end speech signal level;
- means for determining a fifth threshold for at least one estimated echo return loss;
- means for limiting said gain to values below the smallest of said fourth and fifth thresholds.

10. The apparatus of claim 6, further comprising a low pass filter for filtering said gain before application to said far-end speech signal.

* * * * *